United States Patent
Shaw

(10) Patent No.: US 11,349,263 B1
(45) Date of Patent: May 31, 2022

(54) ELECTROMAGNETIC INTERFERENCE SHIELDING FOR A COAXIAL CONNECTOR USING A GASKET ASSEMBLY

(71) Applicant: Rockwell Collins, Inc., Cedar Rapids, IA (US)

(72) Inventor: Daniel Shaw, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 17/314,292

(22) Filed: May 7, 2021

(51) Int. Cl.
*H01R 13/66* (2006.01)
*H01R 13/6584* (2011.01)
*H01R 24/54* (2011.01)
*H01R 24/56* (2011.01)

(52) U.S. Cl.
CPC ......... *H01R 13/6584* (2013.01); *H01R 24/54* (2013.01); *H01R 24/56* (2013.01)

(58) Field of Classification Search
CPC .............. H01R 13/719; H01R 13/6471; H01R 13/6658; H01R 124/64; H05K 7/1092
See application file for complete search history.

(56) References Cited

U.S. PATENT DOCUMENTS

| | | |
|---|---|---|
| 6,462,267 B1 | 10/2002 | Spies et al. |
| 6,475,009 B2 * | 11/2002 | Below ................... H01R 24/64 439/271 |
| 6,817,902 B2 * | 11/2004 | Bernardi .............. G02B 6/3893 439/462 |
| 6,903,910 B1 * | 6/2005 | Griesing ............ G01R 29/0821 361/38 |
| 7,286,871 B2 * | 10/2007 | Cohen ................... A61B 5/4094 702/191 |
| 9,203,369 B2 | 12/2015 | Cook et al. |
| 10,581,208 B2 * | 3/2020 | Dupuis .............. H01R 13/6658 |
| 2014/0174813 A1 | 6/2014 | Doneker et al. |
| 2014/0360772 A1 | 12/2014 | Coppola et al. |

FOREIGN PATENT DOCUMENTS

| | | |
|---|---|---|
| CN | 202058479 U | 11/2011 |
| EP | 1272024 B1 | 3/2009 |
| KR | 101178869 B1 | 9/2012 |

* cited by examiner

*Primary Examiner* — Phuong Chi Thi Nguyen
(74) *Attorney, Agent, or Firm* — Suiter Swantz pc llo

(57) ABSTRACT

An electromagnetic interference (EMI) shield system is disclosed. The system may include an EMI gasket assembly configured to prevent radio frequency (RF) radiation from escaping through a gap between a RF connector and the enclosure. The gasket assembly may include a gasket including a receiving portion. The receiving portion may be configured to receive a portion of a shaft of the RF connector. The gasket may be formed of a compressible material. The gasket assembly may include a spacer configured to couple to a portion of the shaft of the RF connector. The spacer may be configured to compress the gasket against a portion of the enclosure when the spacer is rotated in a first direction. The spacer may be configured to provide electrical continuity between the radio frequency connector and the gasket by causing the gasket to form an electrical connection with the enclosure when the gasket is compressed.

13 Claims, 8 Drawing Sheets

ELECTROMAGNETIC INTERFERENCE SHIELDING FOR A COAXIAL CONNECTOR USING A GASKET ASSEMBLY

GOVERNMENT SUPPORT

This technology was developed with U.S. government support under N00039-14-D-0004 awarded by the U.S. Navy. The U.S. government has certain rights in this invention.

BACKGROUND

Electromagnetic radiation can escape from enclosures or can enter the enclosures, which results in electromagnetic interference (EMI). EMI can result in malfunction and damage to electrical and electronic circuitry positioned nearby the enclosures. Further, EMI can cause potential health hazards if not properly shielded.

SUMMARY

An electromagnetic interference shield system is disclosed, in accordance with one or more embodiments of the disclosure. In one embodiment, the system includes an enclosure. In another embodiment, the enclosure includes one or more walls, the one or more walls defining an internal cavity configured to store one or more sensitive electronics. In another embodiment, the enclosure includes an opening disposed in a wall of the one or more walls. In another embodiment, the system includes a radio frequency connector protruding from the wall of the one or more walls through the opening, a portion of the radio frequency connector and a portion of the opening at least partially forming a gap.

In another embodiment, the system includes an electromagnetic interference gasket assembly configured to prevent radio frequency radiation from escaping through the gap. In another embodiment, the electromagnetic interference gasket assembly includes a gasket, the gasket including a receiving portion, the receiving portion of the gasket configured to receive a portion of a shaft of the radio frequency connector, the gasket formed of a compressible material. In another embodiment, the electromagnetic interference gasket assembly includes a spacer, the spacer configured to couple to a portion of the shaft of the radio frequency connector, the spacer configured to compress the gasket against a portion of the one or more walls of the enclosure when the spacer is rotated in a first direction, the spacer configured to provide electrical continuity between the radio frequency connector and the gasket by causing the gasket to form an electrical connection with the enclosure when the gasket is compressed, the spacer configured to de-compress the gasket from a portion of the one or more walls of the enclosure when the spacer is rotated in a second direction.

In some embodiments, the shaft of the radio frequency connector may include a threaded shaft portion.

In some embodiments, the spacer may include a threaded spacer including one or more threaded portions.

In some embodiments, the one or more threaded portions of the threaded spacer may be configured to couple to a portion of the threaded shaft portion of the radio frequency connector when the gasket is compressed using the threaded spacer.

In some embodiments, the threaded shaft portion of the radio frequency connector may be configured to couple to a coaxial cable connector.

In some embodiments, a diameter of the receiving portion of the gasket may be greater than a diameter of a shaft of the radio frequency connector.

In some embodiments, a diameter of the receiving portion of the gasket may be greater than a diameter of the one or more openings.

In some embodiments, the spacer may be rotated in a clockwise direction to compress the gasket against a portion of the one or more walls.

In some embodiments, the spacer may be rotated in a counter-clockwise direction to de-compress the gasket from a portion of the one or more walls.

In some embodiments, the radio frequency connector may include a female radio frequency connector.

In some embodiments, the gasket may be formed of a compressible, woven material.

In some embodiments, the compressible, woven material may include woven aluminum.

In some embodiments, the spacer may be formed of aluminum.

A method of installing a gasket assembly is disclosed, in accordance with one or more embodiments of the present disclosure. In one embodiment, the method includes installing a gasket onto a pre-installed radio frequency connector on an enclosure. In another embodiment, the method includes coupling a spacer to a portion of the pre-installed radio frequency connector. In another embodiment, the method includes compressing the gasket by rotating the spacer in a first direction.

In some embodiments, the method may further comprise coupling a coaxial cable to a portion of the pre-installed radio frequency connector.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are examples and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the disclosure are disclosed in the following detailed description and the accompanying drawings. The drawings are not necessarily to scale. In general, operations of disclosed processes may be performed in an arbitrary order, unless otherwise provided in the claims. In the drawings:

DETAILED DESCRIPTION OF THE INVENTION

Figure 1:
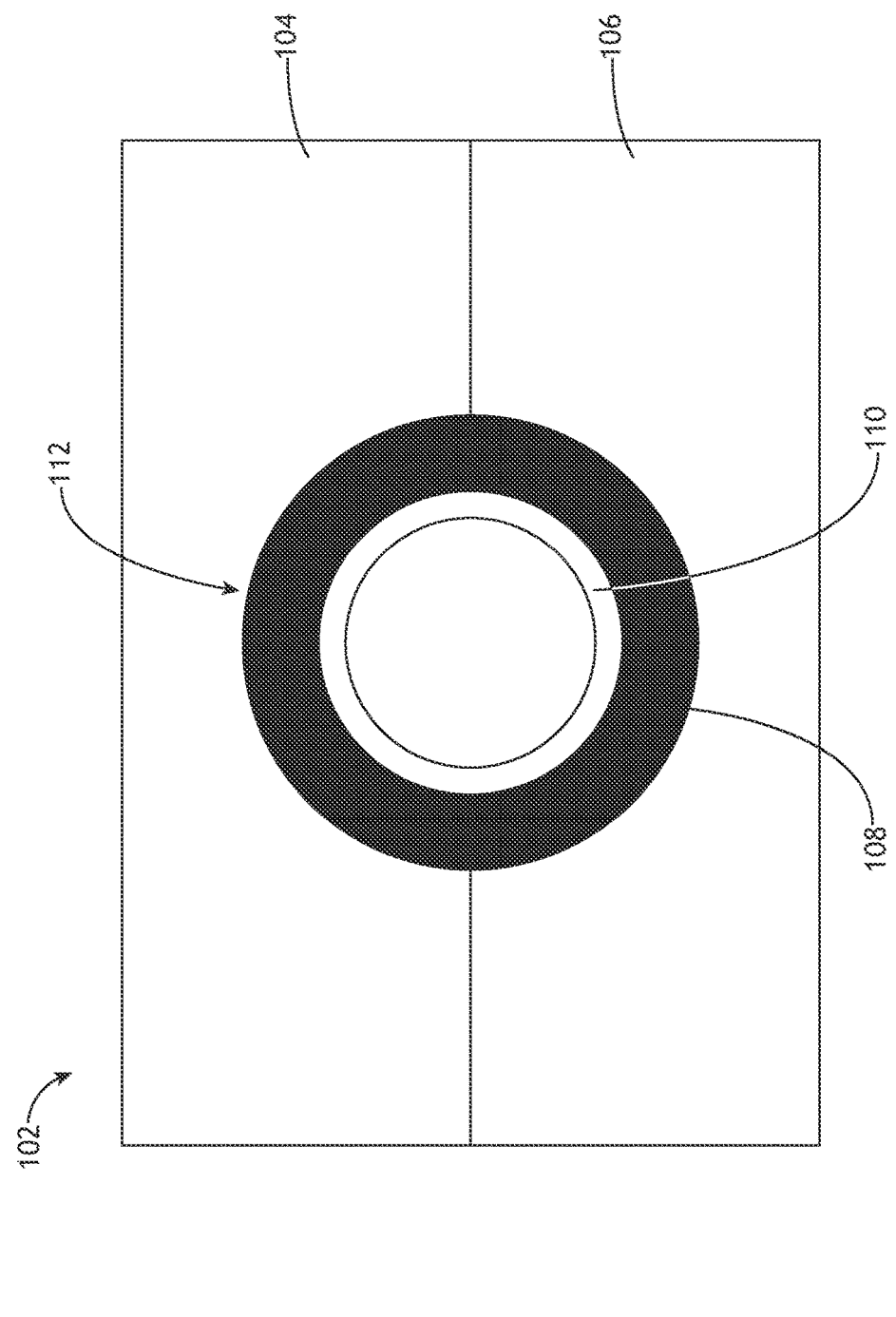
FIG. 1 illustrates a plan view of an enclosure, in accordance with one or more embodiments of the disclosure.

Reference will now be made in detail to the subject matter disclosed, which is illustrated in the accompanying drawings.

Before explaining one or more embodiments of the disclosure in detail, it is to be understood the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination of or sub-combination of two or more such features, along with any other features which may not necessarily be expressly described or inherently present in the instant disclosure.

FIGS. 1-7 in general illustrate an electromagnetic interference (EMI) gasket assembly, in accordance with one or more embodiments of the disclosure.

Coaxial connectors are used to connect cables to other devices and are designed to maintain shielding on the cable. Bulkhead connectors are widely used with coaxial connectors to route power and data into isolated environments. However, such bulkhead connectors constrain designs, raise costs, and trigger electrical problems. The coaxial connector may protrude through a hole formed in the enclosure to connect to external components without the need for a bulkhead connector. However, the gap between the hole and the shaft of the coaxial connector allows for undesired radiation to leave or enter the enclosure, resulting in electromagnetic interference (EMI). EMI can result in malfunction and damage to electrical and electronic circuitry positioned nearby the enclosures. Further, EMI can cause potential health hazards if not properly shielded.

Conventional EMI shielding for a coaxial connector passing through a hole in an enclosure uses a fabric over foam (FOF) material wrapped around the outer portion of the coaxial connector where it passes through the wall of the enclosure. For an effective EMI shield, the hole must be sized such that the wrapped FOF gasket is compressed within the hole in the enclosure wall. In this arrangement, the half of the FOF gasket inside the enclosure can overheat from induced high current. For example, high intensity electromagnetic fields may cause excess RF currents to flow in regions of the FOF material that can result in heat damage to regions where FOF exposure is not in direct heat sink contact with the chassis or lid.

In addition, in select industries EMI shielding devices may be required to meet guidelines and/or standards. For example, EMI shielding devices may be required to meet governmental agency guidelines and/or standards. For instance, the select enclosures may need to be configured in accordance with governmental agency guidelines, military guidelines, and/or standards put forth by, but not limited to, the Federal Communications Commission (FCC), the United States Department of Defense, or the like. EMI gaskets may present difficulties such as, but not limited to, failing to meet standards as set forth by MIL-STD-285, MILITARY STANDARD ATTENUATION MEASUREMENTS FOR ENCLOSURES, ELECTROMAGNETIC SHIELDING, FOR ELECTRONIC TEST PURPOSES, METHOD OF.

As such, it would be desirable to provide a gasket assembly. The gasket assembly should eliminate the need for bulkhead connectors. The gasket assembly should avoid the need for tight tolerances in the mechanical dimensions of the hole through which the connector passes through. The gasket assembly should prevent overheating of a portion of the EMI gasket. The gasket assembly should be configured in accordance with various guidelines and/or standards.

Referring in general to FIGS. 1-5B, one or more EMI gasket assemblies may be integrated with an enclosure 100. For example, the enclosure 100 may include one or more walls 102 that define an internal cavity to store sensitive electronics such as, but not limited to, circuit components, conductors, or the like.

The enclosure 100 may include a lid 104 and a chassis 106. For example, the enclosure 100 may include a lid 104 secured to a chassis 106. The chassis 106 may be formed of the one or more walls 102 to at least partially define an internal cavity to store the sensitive electronics. The lid 104 may be formed of the one or more walls 102 to secure the internal cavity including the sensitive electronics.

It is noted that the enclosure 100 may be formed of any mechanically rigid and electrically conductive material known in the art including, but not limited to, aluminum, or the like.

Figure 2A:
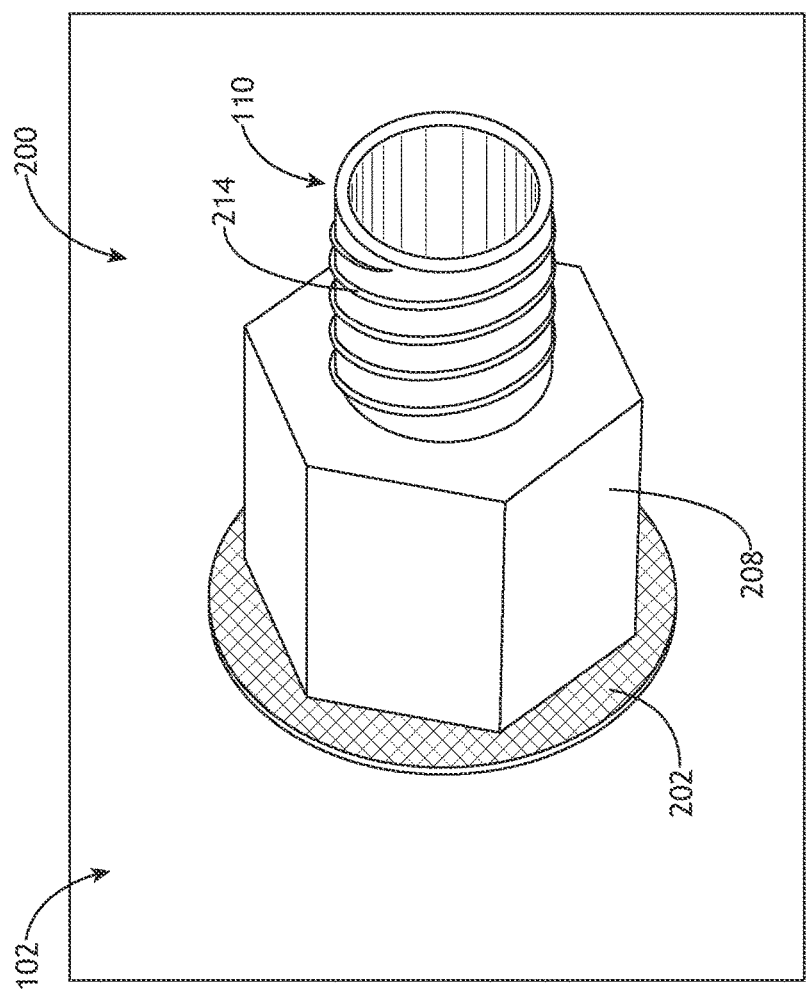
FIG. 2A illustrates a perspective view of an EMI gasket assembly integrated with the enclosure, in accordance with one or more embodiments of the disclosure.
Figure 2B:
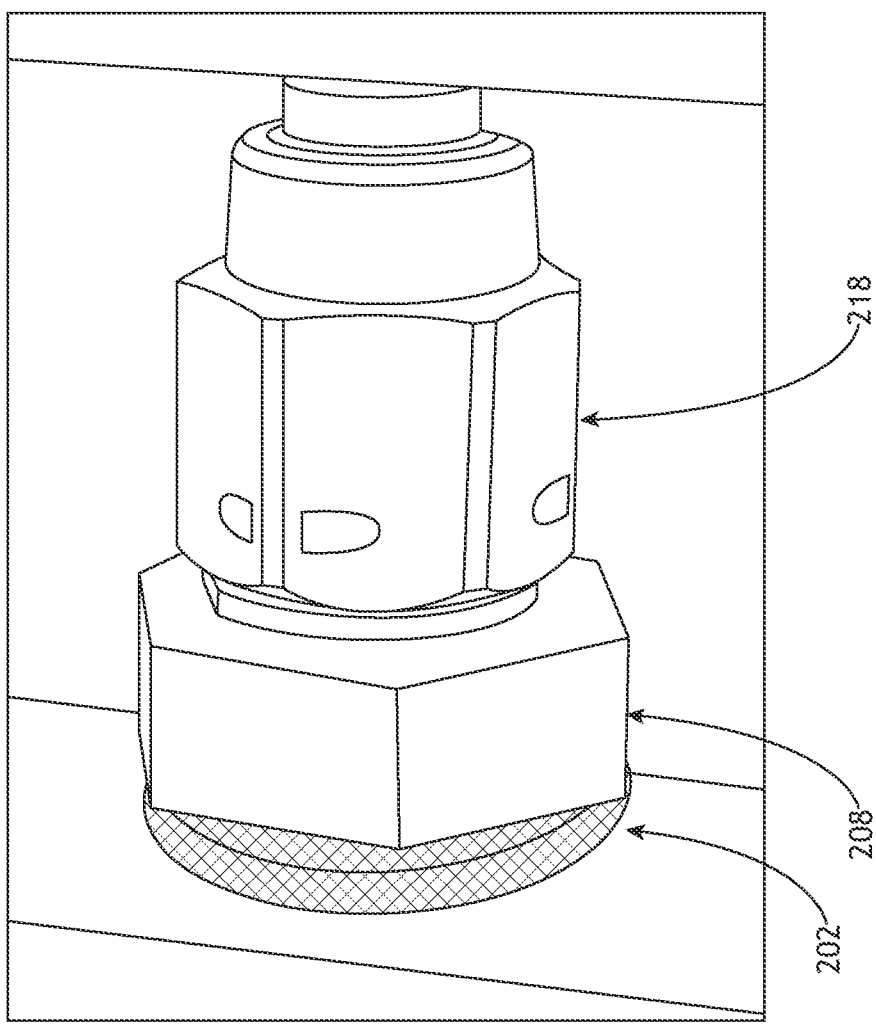
FIG. 2B illustrates a perspective view of the EMI gasket assembly coupled to an RF cable and connector, in accordance with one or more embodiments of the disclosure.
Figure 3:
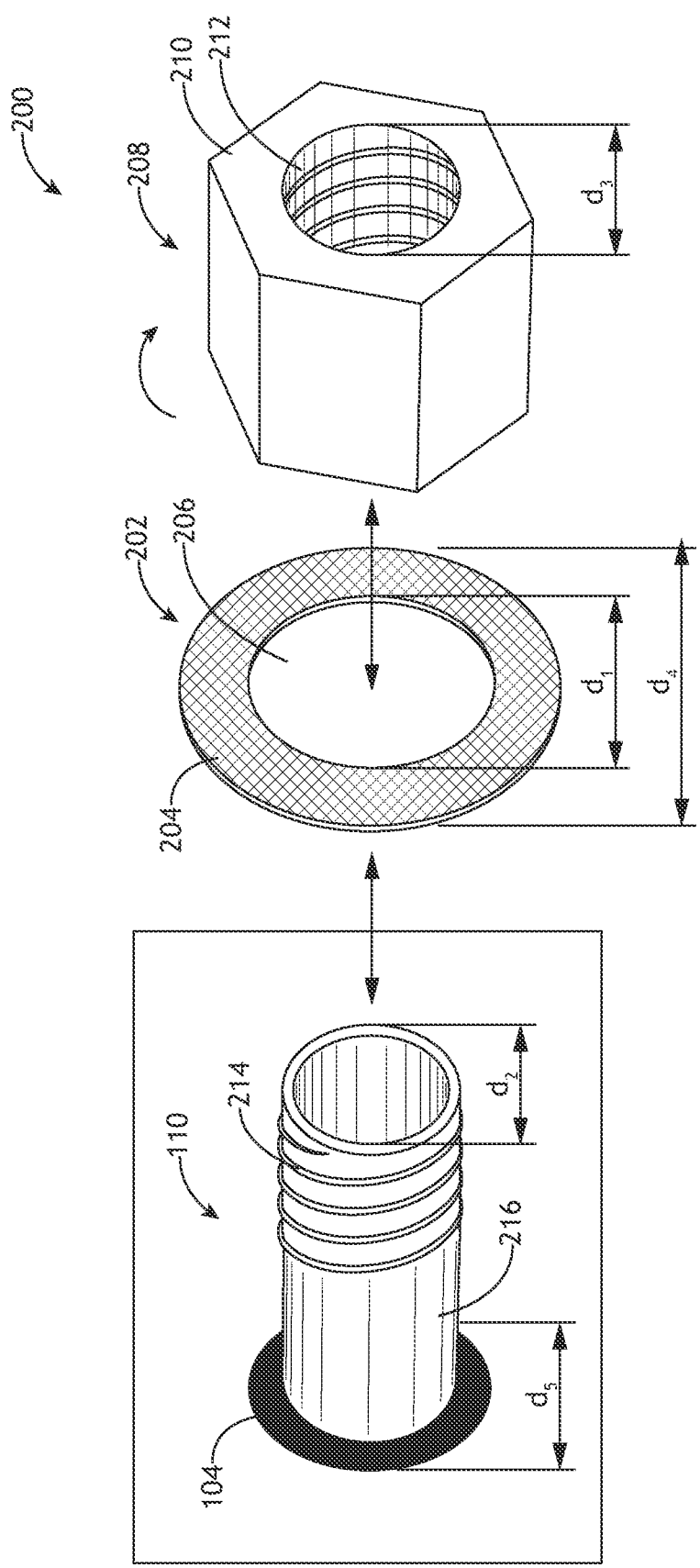
FIG. 3 illustrates an exploded view of the EMI gasket assembly, in accordance with one or more embodiments of the disclosure.
Figure 4B:
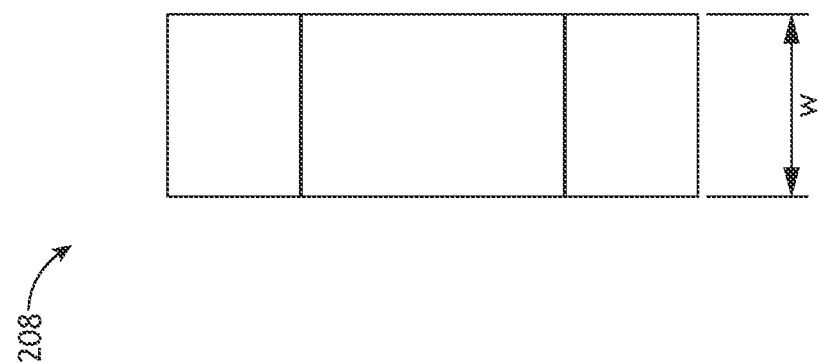
FIG. 4B illustrates a side plan view of the spacer of the EMI gasket assembly, in accordance with one or more embodiments of the disclosure.
Figure 4A:
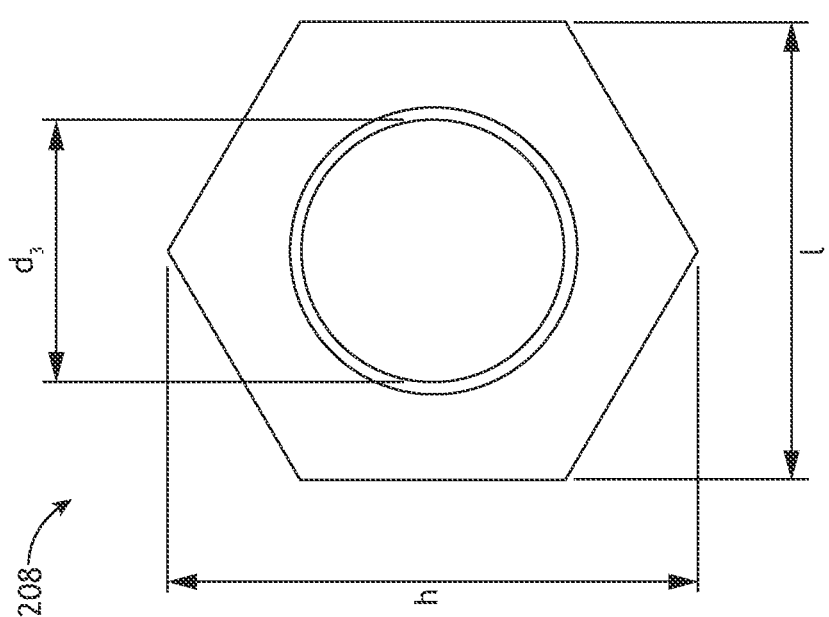
FIG. 4A illustrates a front plan view of a spacer of the EMI gasket assembly, in accordance with one or more embodiments of the disclosure.
Figure 5B:
FIG. 5B illustrates a side plan view of the gasket of the EMI gasket assembly, in accordance with one or more embodiments of the disclosure.
Figure 5A:
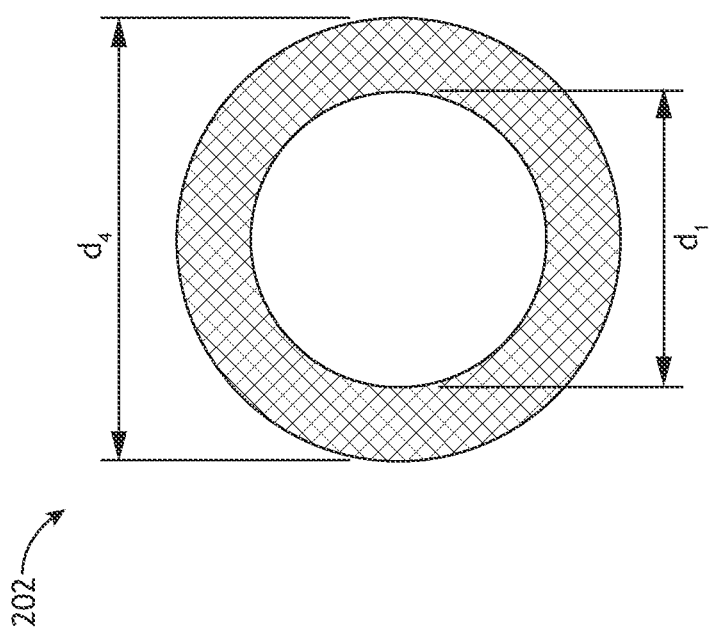
FIG. 5A illustrates a front plan view of a gasket of the EMI gasket assembly, in accordance with one or more embodiments of the disclosure.

The enclosure 100 may include one or more openings 108 disposed in the one or more walls 102 of the enclosure 100. For example, when the lid 104 and the chassis 106 are connected, the lid 104 and the chassis 106 may form one or more openings 108 through which an RF connector 110 may protrude. In this example, a gap 112 may be formed between the RF connector 110 and the wall 102 that defines the opening 108. Although FIGS. 1-3 depict the RF connector 110 as a female RF connector, it is noted that the RF connector 110 may also include a male RF connector. Therefore, the above description and related figures should not be construed as limiting the scope of the present disclosure.

Figure 6:
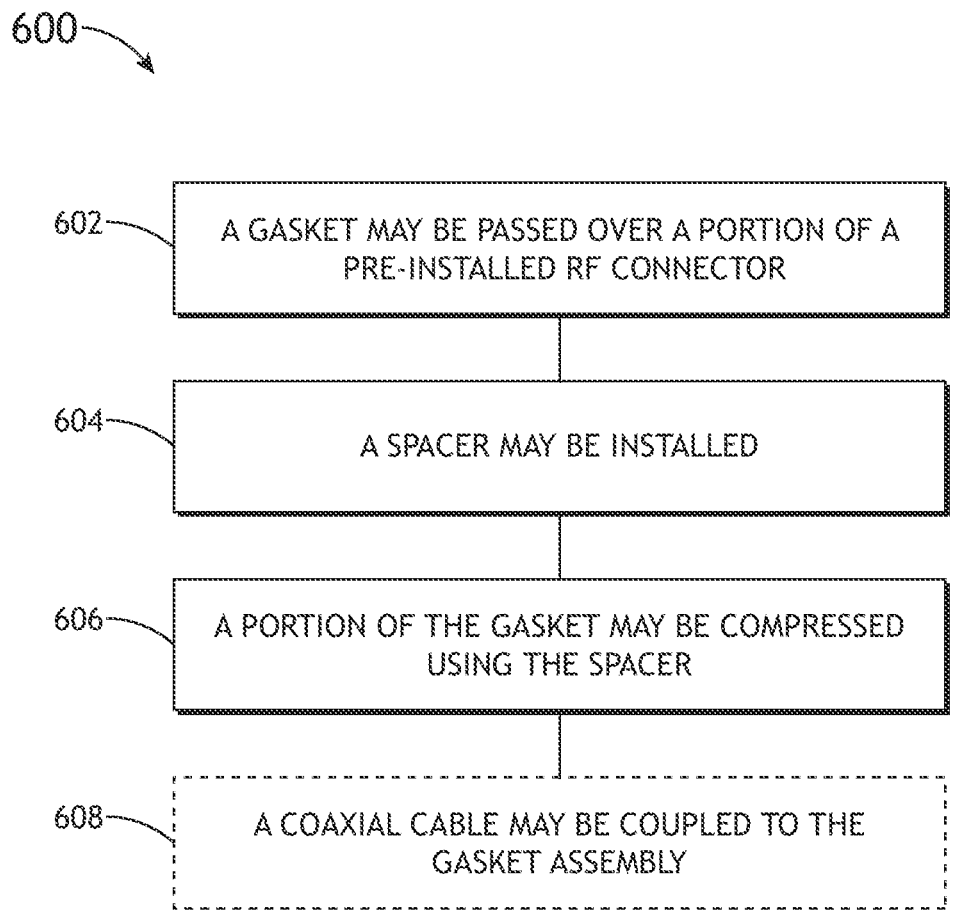
FIG. 6 illustrates a flowchart depicting a method or process for assembling the EMI gasket assembly, in accordance with one or more embodiments of the disclosure.
Figure 7:
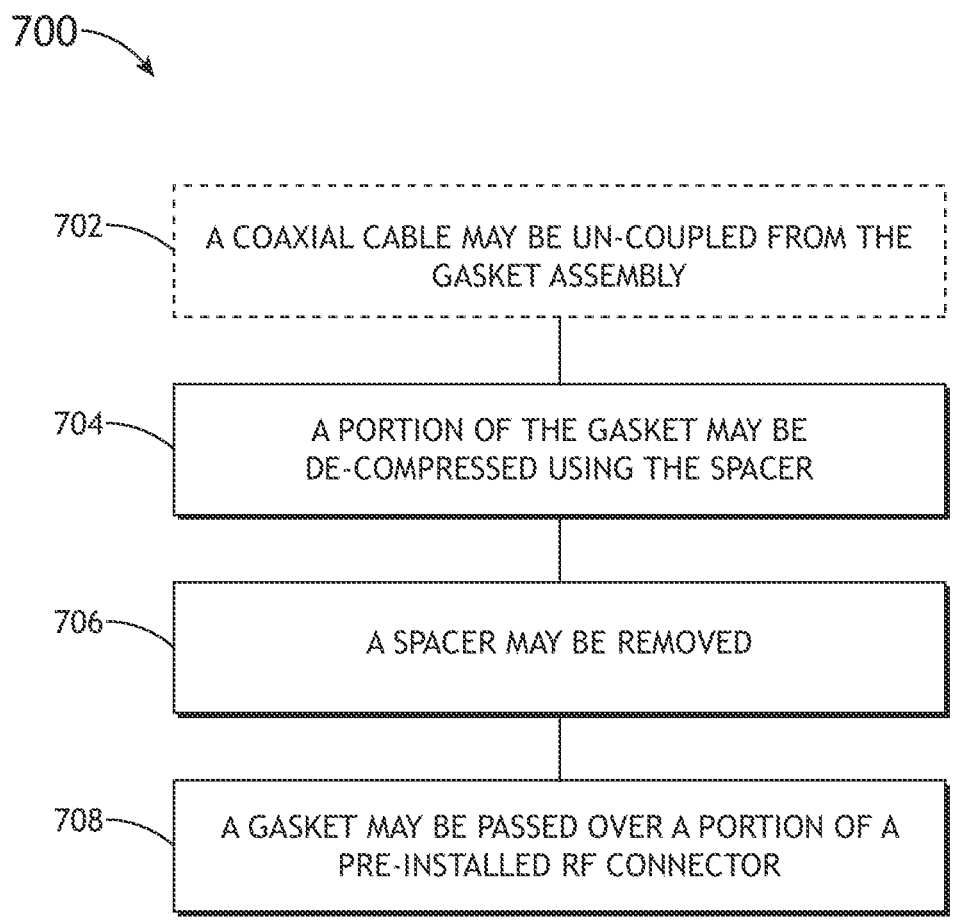
FIG. 7 illustrates a flowchart depicting a method or process for disassembling the EMI gasket assembly, in accordance with one or more embodiments of the disclosure.

FIGS. 2-5B illustrate components of the EMI gasket assembly 200, in accordance with one or more embodiments of the disclosure. FIG. 6 is a method or process 600 for assembling the EMI gasket assembly 200, in accordance with one or more embodiments of the disclosure. FIG. 7 is a method or process 700 for disassembling the EMI gasket assembly 200, in accordance with one or more embodiments of the disclosure.

The EMI gasket assembly 200 may be configured to bridge the gap 112, formed between the connector 110 and the enclosure wall 102, to prevent high power radio frequency (RF) signals from escaping through the opening 108 through which the connector 110 protrudes.

The assembly 200 may include gasket 202 configured to receive a portion of the RF connector 110. For example, the assembly 200 may include a concentric circle gasket 202 including an outer circle portion 204 and a center circle portion 206 (a receiving portion 206), where the center circle portion 206 may be configured to receive a portion of the RF connector 110 shaft. For instance, the diameter $d_1$ of the center circle portion 206 may be dimensioned such that the gasket 202 may pass over a portion of the shaft of the RF connector 110. The diameter $d_1$ of the center circle portion 206 may be between 0-1.00 inches. For example, the diameter $d_1$ of the center circle portion may be between 0.25-0.75 inches. For instance, the diameter $d_1$ of the center circle portion 206 may be 0.50 inches. In this regard, the diameter $d_1$ of the center circle portion 206 may be greater than the diameter $d_2$ of the RF connector 110 (including the threaded portion of the shaft), such that the center circle portion 206 may pass over the shaft of the RF connector 110 without damaging the gasket 202.

The gasket 202 may be formed of a compressible conductive material. For example, the gasket 202 may include a mesh gasket 202 formed of a woven conductive material. It is noted that the gasket 202 may be formed of any conductive material known in the art including, but not limited to, woven aluminum, or the like. Further, it is noted that the material of the one or more components of the gasket assembly 200 may be configured to not react chemically or electrically with one or more additional components of the gasket assembly 200 or enclosure 100, or vice versa. Further, it is noted that where the gasket 202 makes contact with the enclosure 100, the enclosure 100 is free from any electrically insulating coating or material that would prevent the gasket 202 from forming a good electrical connection between the gasket and the enclosure 100.

The assembly 200 may include a spacer 208 configured to receive to a portion of the RF connector 110. It is noted that the spacer 208 may be formed of any conductive material known in the art including, but not limited to, aluminum, or the like.

The spacer 208 may include a surface 210 that defines a hole 212 (an internal cavity 212) configured to receive a portion of the RF connector 110. The hole 212 may be dimensioned to pass over a portion of the RF connector 110. For example, the diameter $d_3$ of the hole 212 may be dimensioned such that the spacer 208 may pass over a portion of the shaft of the RF connector 110. In this regard, the diameter $d_3$ of the hole 212 may be greater than or equal to the diameter $d_2$ of the RF connector 110.

The assembly 200 may include a threaded spacer 208 configured to engage with a threaded portion 214 of the RF connector 110. For example, the hole 212 defined by the surface 210 may be at least partially threaded. In this regard, when the threaded spacer 208 is rotated (e.g., rotated clockwise), the threaded spacer 208 may be configured to compress the gasket 202 against a portion of the enclosure wall 102.

The spacer 208 may be dimensioned to engage with a portion of the RF connector 110 while also compressing the gasket 202 against a portion of the enclosure wall 102. For example, the width w of the spacer 208 may be dimensioned such that the spacer 208 may engage with a portion of the threaded shaft 214 of the RF connector 110 when the threaded spacer 208 compresses the gasket 202 against the portion of the enclosure. Further, the width w of the spacer 208 may be dimensioned such that when the spacer 208 is engaged with a portion of the threads 214 of the RF connector 110, a predetermined amount of portion of the threaded shaft 214 of the RF connector 110 is exposed. For example, the width w of the spacer may be approximately 0.280 inches. In this regard, the exposed threads 214 of the RF connector 110 may be capable of coupling with an RF cable (as shown in FIG. 2B), such that the cable has enough threads to be torqued a specified amount. Further, this ensures that spacer 208 is secured in place, to prevent leakage through any component of the gasket assembly 200 or enclosure 100.

The spacer 208 may be dimensioned to compress the gasket 202 against the enclosure 100. For example, a height h and a length l of the spacer 208 may be dimensioned to compress the gasket 202 against the enclosure 100. For instance, the spacer may have a height h of 0.808 inches and a length l of 0.700 inches.

The threaded spacer 208 may form a positive electrical contact between the shaft of the RF connector 110, the gasket 202, and the chassis wall 106, resulting in an effective EMI shield. The gasket 202 may be dimensioned to bridge the gap 112 between the RF connector 110 and the opening 108. For example, the diameter $d_4$ of the outer circle portion 204 of the gasket 202 may be greater than the diameter $d_5$ of the gap 112. By way of another example, the diameter $d_2$ of the center circle portion 206 of the gasket 202 may be greater than the diameter $d_5$ of the gap 112, such that the gap 112 is covered by the gasket 202. The diameter $d_4$ of the outer circle portion 204 may be between 0-1.50 inches. For example, the diameter $d_4$ of the outer circle portion may be between 0.60-90 inches. For instance, the diameter $d_1$ of the center circle portion 206 may be 0.75 inches. In this regard, when the gasket 202 is compressed against a portion of the enclosure wall 102, the gasket 202 may prevent EMI radiation from escaping from the enclosure 100 through the gap 112. Further, when the gasket 202 is compressed against a portion of the enclosure wall 102, the gasket 202 may prevent EMI radiation from entering the enclosure 100 through the gap 112.

It is noted that the gasket 202 in direct contact with the wall 102 of the enclosure 100 may not only shield high frequency energy from passing through the gap 112, but also provide an effective heat sink for the gasket 202 to prevent overheating in the presence of high power electromagnetic fields.

The gasket assembly 200 may include any type of spacer 208. For example, as shown in FIGS. 2A-4A, the gasket assembly 200 may include a threaded hexagonal spacer. By way of another example, the gasket assembly 200 may include a threaded cylindrical spacer. Although FIG. 3 depicts the spacer 208 as a threaded spacer, it is noted that the gasket assembly 200 may include a non-threaded spacer configured to receive a portion of a shaft (threaded or non-threaded) of the RF connector 110.

Although FIGS. 1-3 depict the spacer 208 engaged with a female RF connector 110, it is noted that the spacer 208 may be configured to engage with a male RF connector. For example, the spacer 208 may be configured to couple to a portion of the male RF connector and a portion of the female RF connector of the coaxial cable.

Assembling the assembly 200 may include one or more of the following steps of the method or process 600:

In a step 602, a gasket 202 may be passed over a portion of a pre-installed RF connector 110, where the pre-installed RF connector 110 may protrude through an opening 108 in the chassis 106 of the enclosure 100. For example, the assembly 200 may include a concentric circle gasket 202 including an outer circle portion 204 and a center circle portion 206, where the center circle portion 206 may be configured to receive a portion of the pre-installed RF connector 110. For instance, the diameter $d_1$ of the center circle portion 206 may be dimensioned such that the gasket 202 may pass over a portion of the shaft of the RF connector 110. In this regard, the diameter $d_1$ of the center circle portion 206 may be greater than the diameter $d_2$ of the RF connector 110, such that the center circle portion 206 may pass over the shaft of the RF connector 110.

In a step 604, a spacer 208 may be installed. For example, a threaded spacer 208 may engage the threads of the RF connector 110 when the threaded spacer 208 is rotated (clockwise).

In a step 606, a portion of the gasket 202 may be compressed using the spacer 208. For example, the threaded spacer 208 may be rotated (clockwise) to compress the gasket 202 against the wall 102 of the enclosure 100. The spacer 208 may form a good electrical contact between the shaft of the coaxial connector, the mesh material, and the chassis wall resulting in an effective EMI shield. The wire mesh may be in direct contact with the enclosure wall to shield high frequency energy from passing through the circular gap. The wire mesh may be in direct contact with the enclosure to provide an effective heat sink for the wire mesh to prevent overheating in the presence of high power electromagnetic fields.

In a step 608, a coaxial cable may be coupled to the gasket assembly 200. For example, one end of the coaxial cable may couple to the threaded portion of the RF connector 110.

Disassembling the assembly 200 may include one or more of the following steps of the method or process 700:

In a step 702, a coaxial cable may be un-coupled from the gasket assembly 200. For example, one end of the coaxial cable may be un-coupled from the threaded portion of the RF connector 110.

In a step 704, a portion of the gasket 202 may be de-compressed using the spacer 208. For example, the threaded spacer 208 may be rotated (counter-clockwise) to de-compress the gasket 202 from the wall 102 of the enclosure 100.

In a step 706, a spacer 208 may be removed. For example, a threaded spacer 208 may disengage the threads of the RF connector 110 when the threaded spacer 208 is rotated (counter-clockwise).

In a step 708, a gasket 202 may be passed over a portion of a pre-installed RF connector 110. For example, the center circle portion 206 of the gasket 202 may pass over a portion of the shaft of the RF connector 110.

It is noted herein the methods or processes 600, 700 is not limited to the steps and/or sub-steps provided. The methods or processes 600, 700 may include more or fewer steps and/or sub-steps. In addition, the methods or processes 600, 700 may perform the steps and/or sub-steps simultaneously. Further, the methods or processes 600, 700 may perform the steps and/or sub-steps sequentially, including in the order provided or an order other than provided. Therefore, the above description should not be interpreted as a limitation on the scope of the disclosure but merely an illustration.

It is to be understood that embodiments of the methods disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

What is claimed:

1. An electromagnetic interference shield system comprising:
    an enclosure, the enclosure comprising:
        one or more walls, the one or more walls defining an internal cavity configured to store one or more sensitive electronics; and
        an opening disposed in a wall of the one or more walls;
    a radio frequency connector protruding from the wall of the one or more walls through the opening, a portion of the radio frequency connector and a portion of the opening at least partially forming a gap; and
    an electromagnetic interference gasket assembly configured to prevent radio frequency radiation from escaping through the gap, the electromagnetic interference gasket assembly comprising:
        a gasket, the gasket including a receiving portion, the receiving portion of the gasket configured to receive a portion of a shaft of the radio frequency connector, the gasket formed of a compressible material; and
        a spacer, the spacer configured to couple to a portion of the shaft of the radio frequency connector, the spacer configured to compress the gasket against a portion of the one or more walls of the enclosure when the spacer is rotated in a first direction, the spacer configured to provide electrical continuity between the radio frequency connector and the gasket by causing the gasket to form an electrical connection with the enclosure when the gasket is compressed, the spacer configured to de-compress the gasket from a portion of the one or more walls of the enclosure when the spacer is rotated in a second direction.

2. The system of claim 1, wherein the shaft of the radio frequency connector includes a threaded shaft portion.

3. The system of claim 1, wherein the spacer includes a threaded spacer including one or more threaded portions.

4. The system of claim 1, wherein the one or more threaded portions of the threaded spacer are configured to couple to a portion of the threaded shaft portion of the radio frequency connector when the gasket is compressed using the threaded spacer.

5. The system of claim 1, wherein the threaded shaft portion of the radio frequency connector is configured to couple to a coaxial cable connector.

6. The system of claim 1, wherein a diameter of the receiving portion of the gasket is greater than a diameter of a shaft of the radio frequency connector.

7. The system of claim 1, wherein a diameter of the receiving portion of the gasket is greater than a diameter of the one or more openings.

8. The system of claim 1, wherein the spacer is rotated in a clockwise direction to compress the gasket against a portion of the one or more walls.

9. The system of claim 1, wherein the spacer is rotated in a counter-clockwise direction to de-compress the gasket from a portion of the one or more walls.

10. The system of claim 1, wherein the radio frequency connector includes a female radio frequency connector.

11. The system of claim 1, wherein the spacer is formed of aluminum.

12. The system of claim 1, wherein the gasket is formed of a compressible, woven material.

13. The system of claim 12, wherein the compressible, woven material includes woven aluminum.

* * * * *